US010553579B2

(12) United States Patent
Li

(10) Patent No.: US 10,553,579 B2
(45) Date of Patent: Feb. 4, 2020

(54) SEMICONDUCTOR RESISTOR AND MANUFACTURING METHOD THEREFOR

(71) Applicants: Semiconductor Manufacturing International (Beijing) Corporation, Beijing (CN); Semiconductor Manufacturing International (Shanghai) Corporation, Shanghai (CN)

(72) Inventor: Yong Li, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 15/683,166

(22) Filed: Aug. 22, 2017

(65) Prior Publication Data
US 2018/0145069 A1    May 24, 2018

(30) Foreign Application Priority Data

Nov. 23, 2016  (CN) .......................... 2016 1 1046393

(51) Int. Cl.
*H01L 27/08* (2006.01)
*H01L 49/02* (2006.01)
(52) U.S. Cl.
CPC .......... *H01L 27/0802* (2013.01); *H01L 28/20* (2013.01)
(58) Field of Classification Search
CPC ............... H01L 27/0802; H01L 29/785; H01L 27/0629; H01L 29/66795; H01L 28/20; H01L 29/6681
See application file for complete search history.

(56) References Cited

U.S. PATENT DOCUMENTS

2003/0141569 A1*  7/2003 Fried ................... H01L 27/0802
                                                      257/536
2005/0067674 A1*  3/2005 Maget ................. H01L 27/0808
                                                      257/595
(Continued)

FOREIGN PATENT DOCUMENTS

CN          103383964        11/2013

OTHER PUBLICATIONS

Extended European Search Report dated May 9, 2018 for EP Application No. 17 20 2879.7 (8 pp.).

*Primary Examiner* — Charles D Garber
*Assistant Examiner* — S M Sohel Imtiaz
(74) *Attorney, Agent, or Firm* — Brinks Gilson & Lione

(57) ABSTRACT

The present disclosure relates to a technical field of semiconductors and discloses a semiconductor resistor and a manufacturing method therefor. The method includes: providing a substrate structure, where the substrate structure includes a substrate having a well region and a fin structure in the well region, and where the fin structure includes a semiconductor fin and an insulating layer at a surface of the semiconductor fin; forming a first dummy gate structure and a second dummy gate structure at two end portions of the fin structure, respectively; forming a mask layer having a first opening and a second opening, where the first opening exposes the first dummy gate structure and a part of the fin structure that abuts against the first dummy gate structure, and the second opening exposes the second dummy gate structure and a part of the fin structure that abuts against the second dummy gate structure; etching an exposed part of the fin structure that abuts against the first dummy gate structure using the mask layer as a mask and etching an exposed part of the fin structure that abuts against the second dummy gate structure using the mask layer as a mask, so as to form a first recess and a second recess; removing the mask layer, and (Continued)

epitaxially growing a semiconductor material in the first recess and the second recess, so as to respectively form a first contact area and a second contact area; and forming a first contact connected to the first contact area and a second contact connected to the second contact area.

13 Claims, 6 Drawing Sheets

(56) References Cited

U.S. PATENT DOCUMENTS

| | | | |
|---|---|---|---|
| 2010/0013026 A1* | 1/2010 | Booth, Jr. | H01L 27/0629 257/379 |
| 2011/0057267 A1* | 3/2011 | Chuang | H01L 21/823842 257/380 |
| 2012/0175749 A1* | 7/2012 | Haensch | H01L 21/845 257/623 |
| 2013/0292777 A1* | 11/2013 | Liaw | G11C 11/412 257/369 |
| 2014/0017863 A1* | 1/2014 | Lee | H01L 29/66477 438/238 |
| 2014/0134822 A1* | 5/2014 | Srinivasan | H01L 29/66795 438/382 |
| 2014/0264289 A1* | 9/2014 | Chuang | H01L 29/66356 257/39 |
| 2015/0061076 A1* | 3/2015 | Cheng | H01L 27/0802 257/538 |
| 2015/0147860 A1* | 5/2015 | Kim | H01L 29/66795 438/283 |
| 2015/0179632 A1* | 6/2015 | Sidelnicov | H01L 27/0629 257/379 |
| 2015/0214372 A1* | 7/2015 | Hofmann | H01L 29/7855 257/392 |
| 2016/0190229 A1* | 6/2016 | Singh | H01L 28/20 257/380 |
| 2016/0268392 A1* | 9/2016 | Zhu | H01L 21/76224 |
| 2016/0284695 A1* | 9/2016 | Liaw | H01L 27/088 |
| 2016/0351590 A1* | 12/2016 | Cheng | H01L 27/1211 |
| 2018/0114826 A1* | 4/2018 | Adusumilli | H01L 28/24 |

* cited by examiner

SEMICONDUCTOR RESISTOR AND MANUFACTURING METHOD THEREFOR

CROSS-REFERENCE TO RELATED APPLICATION

The present application claims priority to Chinese Patent Application. No. 201611046393.5, filed Nov. 23, 2016, the entirety of which is hereby incorporated by reference.

BACKGROUND

Technical Field

The present disclosure relates to a technical field of semiconductors, and more particularly to a semiconductor resistor and a manufacturing method therefor.

Related Art

With the development of semiconductor technologies, Fin Field Effect Transistors (Fin Field Effect Transistor, FinFET) are increasingly used in designs for semiconductor devices of a smaller critical dimension.

Conventionally, when manufacturing a semiconductor resistor compatible with the FinFET process, the following manner is often used to form the same: first, forming a plurality of spaced semiconductor fins (Fin); after that, removing an entire upper portion of each semiconductor fin so as to form a recess; then, epitaxially growing a semiconductor material in the recess; and subsequently, forming a contact on the epitaxially grown semiconductor material.

The inventor finds that: semiconductor materials epitaxially grown on adjacent semiconductor fins may be merged. For example, semiconductor materials epitaxially grown at intermediate positions of the semiconductor fins may be merged, so that the adjacent semiconductor fins may be merged. In this way, some of the adjacent semiconductor fins may be merged, and some may not be merged. Therefore, uniformity of the semiconductor fins is worse; this may affect the size of the finally formed semiconductor resistor.

SUMMARY

An objective of the present disclosure is relieving a phenomenon where adjacent semiconductor fins in a semiconductor resistor are merged.

In one form of the present disclosure, a method for manufacturing a semiconductor resistor is provided, including: providing a substrate structure, where the substrate structure includes a substrate having a well region and a fin structure in the well region, wherein the fin structure includes a semiconductor fin and an insulating layer at a surface of the semiconductor fin; forming a first dummy gate structure and a second dummy gate structure at two end portions of the fin structure, respectively; forming a mask layer having a first opening and a second opening, where the first opening exposes the first dummy gate structure and a part of the fin structure that abuts against the first dummy gate structure, and the second opening exposes the second dummy gate structure and a part of the fin structure that abuts against the second dummy gate structure; etching an exposed part of the fin structure that abuts against the first dummy gate structure using the mask layer as a mask and etching an exposed part of the fin structure that abuts against the second dummy gate structure using the mask layer as a mask, so as to form a first recess and a second recess; removing the mask layer and epitaxially growing a semiconductor material in the first recess and the second recess, so as to respectively form a first contact area and a second contact area; and forming a first contact connected to the first contact area and a second contact connected to the second contact area.

In some implementations, side surfaces of the two end portions of the fin structure respectively have a first isolation region and a second isolation region; a part of the first dummy gate structure is located at the first isolation region; and a part of the second dummy gate structure is located at the second isolation region.

In some implementations, the first opening further exposes a part of the first isolation region, and the second opening further exposes a part of the second isolation region.

In some implementations, forming the first contact and the second contact in the first contact area and the second contact area includes: depositing a dielectric layer so as to cover the fin structure, the first dummy gate structure, the second dummy gate structure, the first contact area, and the second contact area; etching the dielectric layer, so as to form a first contact hole extending to the first contact area and a second contact hole extending to the second contact area; and filling in the first contact hole and the second contact hole with a metal to form the first contact and the second contact.

In some implementations, the well region has a first conductivity type; and the method further includes: after the first contact area and the second contact area are formed, executing ion implantation, so that the semiconductor fin, the first contact area, and the second contact area have a second conductivity type which is different from the first conductivity type.

In some implementations, a doping concentration of the first contact area and a doping concentration of the second contact area are higher than a doping concentration of the semiconductor fin.

In some implementations, the fin structure includes a plurality of approximately parallel fin structures; and the first dummy gate structure and the second dummy gate structure are located at two end portions of each fin structure, respectively.

In some implementations, the semiconductor material includes Si or SiGe.

In some implementations, a width of the first dummy gate structure and a width of the second dummy gate structure are between 16-100 nm; a width of the first opening and a width of the second opening are between 86-200 nm; a width of the part of the fin structure that abuts against the first dummy gate structure and a width of the part of the fin structure that abuts against the second dummy gate structure are between 60-120 nm; a width of the first contact hole and a width of the second contact hole are between 40-100 nm; and a distance between the first contact hole and the first dummy gate structure and a distance between the second contact hole and the second dummy gate structure are between 15-40 nm.

In some implementations, a width of the exposed part of the first isolation region and a width of the exposed part of the second isolation region are between 10-50 nm.

In another form of the present disclosure, a semiconductor resistor is provided, including: a substrate having a well region and a fin structure in the well region, where the fin structure includes a semiconductor fin and an insulating layer at a surface of the semiconductor fin; a first dummy gate structure and a second dummy gate structure at two end portions of the fin structure; a first contact area which abuts against the first dummy gate structure, and a part of the first contact area being located in the semiconductor fin; a second contact area which abuts against the second dummy gate structure, wherein a part of the second contact area is located in the semiconductor fin; a first contact connected to the first contact area; and a second contact connected to the second contact area.

In some implementations, side surfaces of the two end portions of the fin structure respectively have a first isolation region and a second isolation region; a part of the first dummy gate structure is located at the first isolation region; and a part of the second dummy gate structure is located at the second isolation region.

In some implementations, the well region has a first conductivity type; and the semiconductor fin, the first contact area, and the second contact area have a second conductivity type.

In some implementations, a doping concentration of the first contact area and a doping concentration of the second contact area are higher than a doping concentration of the semiconductor fin.

In some implementations, the fin structure includes a plurality of approximately parallel fin structures; and the first dummy gate structure and the second dummy gate structure are located at two end portions of each fin structure, respectively.

In some implementations, materials of the first contact area and the second contact area include Si or SiGe.

In some implementations, a width of the first dummy gate structure and a width of the second dummy gate structure are between 16-100 nm; a width of the first contact area and a width of the second contact area are between 60-120 nm; a width of the first contact and a width of the second contact are between 40-100 nm; and a distance between the first contact and the first dummy gate structure and a distance between the second contact and the second dummy gate structure are between 15-40 nm.

In another form of the present disclosure, a method for manufacturing a semiconductor resistor is provided, including: providing a substrate structure, where the substrate structure includes a substrate having a well region and a fin structure in the well region, wherein the fin structure includes a semiconductor fin and an insulating layer at a surface of the semiconductor fin; forming a dummy gate structure at an end portion of the fin structure; forming a mask layer having a first opening and a second opening, where the first opening exposes the dummy gate structure and a part of the fin structure that abuts against the dummy gate structure, and the second opening exposes another end portion of the fin structure; etching the exposed part of the fin structure, using the mask layer as a mask, to form a first recess and a second recess; removing the mask layer, and epitaxially growing a semiconductor material in the first recess and the second recess, so as to respectively form a first contact area and a second contact area; and forming a first contact connected to the first contact area and a second contact connected to the second contact area.

In some forms, a side surface of the end portion of the fin structure has an isolation region; and a part of the dummy gate structure is located at the isolation region.

In some implementations, the first opening further exposes a part of the isolation region.

In a further form of the present disclosure, a semiconductor resistor is provided, including: a substrate having a well region and a fin structure in the well region, where the fin structure includes a semiconductor fin and an insulating layer at a surface of the semiconductor fin; a dummy gate structure at an end portion of the fin structure; a first contact area which abuts against the dummy gate structure, where a part of the first contact area is located in the semiconductor fin; a second contact area, where a part of the second contact area is located in another end portion of the semiconductor fin; a first contact connected to the first contact area; and a second contact connected to the second contact area.

In some implementations, a side surface of the end portion of the fin structure has an isolation region; and a part of the dummy gate structure is located at the isolation region.

In forms of a method for manufacturing a semiconductor resistor provided in the present disclosure, according to an aspect, dummy gate structures are formed at two ends of a fin structure, where the dummy gate structures may change appearances of epitaxially formed first contact area and second contact area. In addition, a position of an etched area is defined by using a first opening and a second opening of a mask layer, and only parts of the fin structure that abut against the first dummy gate structure and the second dummy gate structure are etched. Therefore, an epitaxially formed contact area is located at two end portions of the fin structure instead of the entire upper portion of the fin structure. In this way, a probability that the epitaxially formed contact area merges with contact areas of other fin structures is reduced. Therefore, forms of the present disclosure may relieve a phenomenon that adjacent semiconductor fins in a semiconductor resistor are merged, and improve uniformity of the semiconductor fins in the semiconductor resistor. Moreover, the manufacturing method of the present invention is compatible with the FinFET process.

In the following detailed description, as embodiments and implementations of the present disclosure are described for illustration purposes with reference to the accompanying drawings, other characters, aspects, and advantages of the present invention become clear.

BRIEF DESCRIPTION OF THE DRAWINGS

The accompanying drawings form a part of the specification, describe the embodiments and form of the present disclosure for illustration purposes, and are used to explain the principles of the present disclosure together with the specification. In the accompanying drawings.

DETAILED DESCRIPTION

Embodiments and forms of the present disclosure are described in detail with reference to the accompanying drawings for illustration purposes. It should be understood that unless being described in detail, relative layouts, mathematical expressions, and numeric values of components and steps described in these embodiments should not be understood as a limitation to the scope of the present invention.

In addition, it should be understood that for ease of description, sizes of the parts shown in the accompanying drawings are not necessarily drawn according to an actual proportional relationship. For example, thicknesses or widths of some layers may be magnified with respect to other layers.

The following description about the embodiments and forms are described for illustration purposes only, and should not be used as any limitation on the present disclosure and applications or uses of the present disclosure in any sense.

Technologies, methods, and devices that are known by a person of ordinary skill in the relate fields are not be discussed in detail. However, in cases in which the technologies, methods, and devices are applicable, the technologies, methods, and devices should be considered as a part of the description.

It should be noted that similar reference signs and letters represent similar items in the following accompanying drawings. Therefore, once an item is defined or described in a figure, the item needs not to be further discussed in the description of the subsequent figures.

Figure 1:
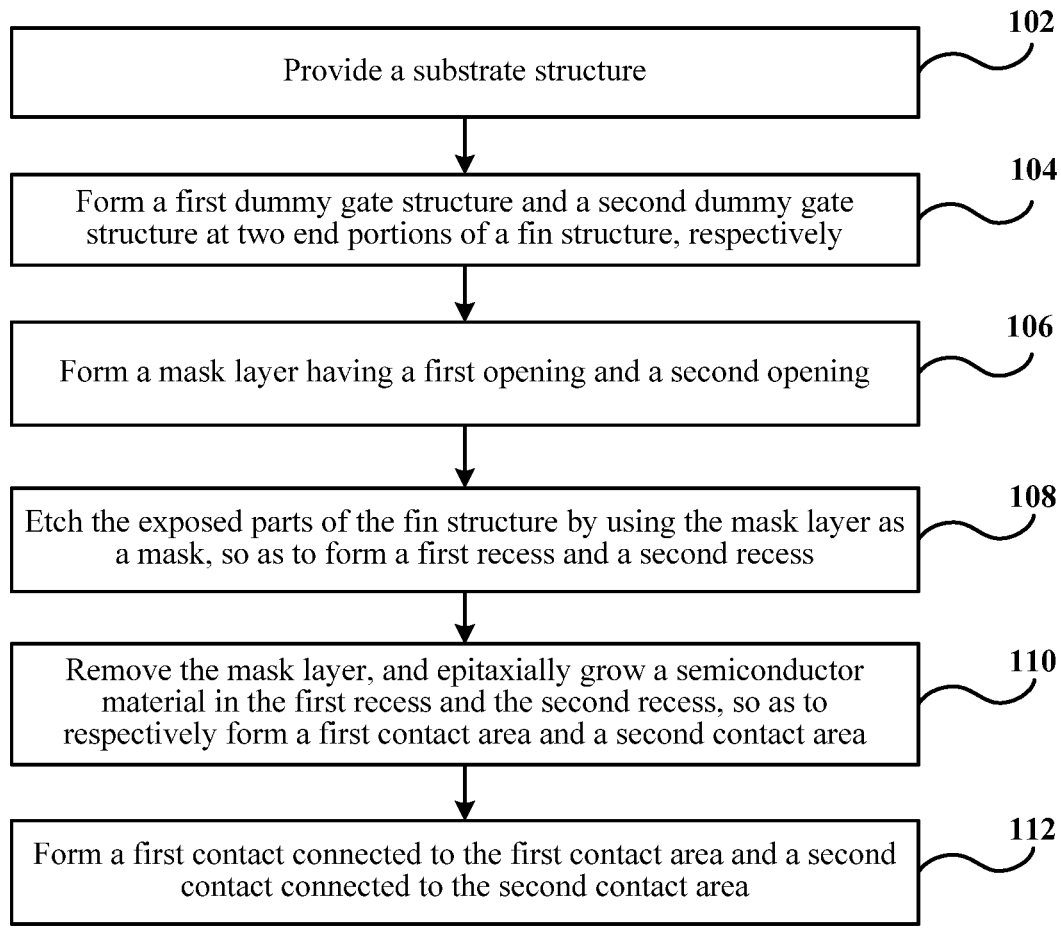
FIG. 1 is a simplified flowchart of one form of a method for manufacturing a semiconductor resistor.

FIG. 1 is a simplified flowchart of one form of a method for manufacturing a semiconductor resistor. As shown in FIG. 1, in step 102, a substrate structure is provided.

Figure 2:
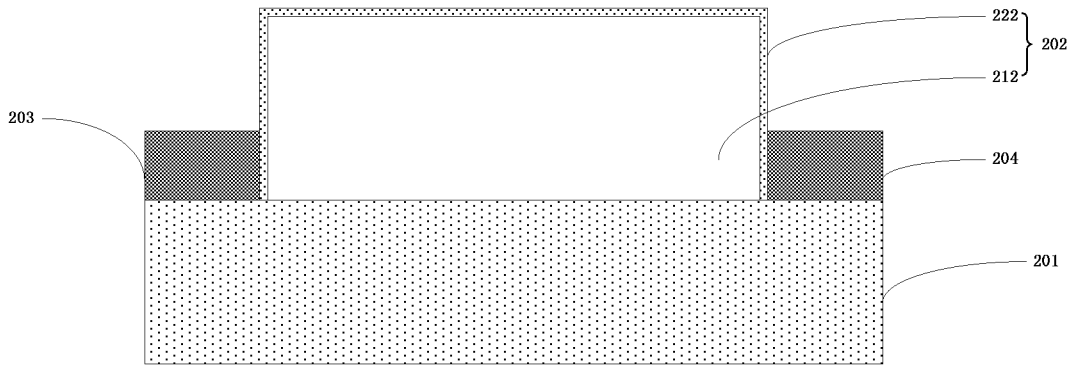
FIG. 2 to FIG. 9 are schematic diagrams of various phases of a method for manufacturing a semiconductor resistor.

FIG. 2A shows a section drawing of a substrate structure according to one form of the present disclosure. As shown in FIG. 2, the substrate structure may include a substrate having a well region 201 and a fin structure 202 in the region 201. Herein, the fin structure 202 includes a semiconductor fin 212 and an insulating layer 222 at a surface of the semiconductor fin 212. Material of the semiconductor fin 212 may be a semiconductor material such as silicon or germanium. Material of the insulating layer 222 may be, for example, an oxide of silicon. In addition, side surfaces of two end portions of the fin structure 202 may respectively have a first isolation region 203 and a second isolation region 204, for example, a shallow trench isolation (STI) region. Upper surfaces of the first isolation region 203 and the second isolation region 204 are lower than an upper surface of the fin structure 202. In an embodiment, the fin structure 202 may include a plurality of approximately parallel fin structures (not shown). The plurality of fin structures may be arranged to be approximately parallel along a direction vertical to the paper surface. An isolation region, for example, a shallow trench isolation (STI) region, may be provided between adjacent fin structures.

Next, in step 104, a first dummy gate structure 301 and a second dummy gate structure 302 are formed at the two end portions of the fin structure 202, respectively. For example, a dummy gate material (such as polysilicon) may be first deposited, then a patterned hard mask may be formed on the dummy gate material, and after that, the dummy gate material is etched by using the patterned hard mask as a mask. In this way, the first dummy gate structure 301 and the second dummy gate structure 302 are formed. Herein, the first dummy gate structure 301 may include a first dummy gate and a first hard mask on the first dummy gate, and the second dummy gate structure 302 may include a second dummy gate and a second hard mask on the second dummy gate. Alternatively, the first dummy gate structure 301 may also merely include a first dummy gate, and the second dummy gate structure 302 may also merely include a second dummy gate. In a case in which the fin structure 202 includes a plurality of fin structures, the formed first dummy gate structure 301 and second dummy gate structure 302 are located at two end portions of each fin structure, respectively. That is, the first dummy gate structure 301 and the second dummy gate structure 302 span the two end portions of each fin structure.

Figure 3:
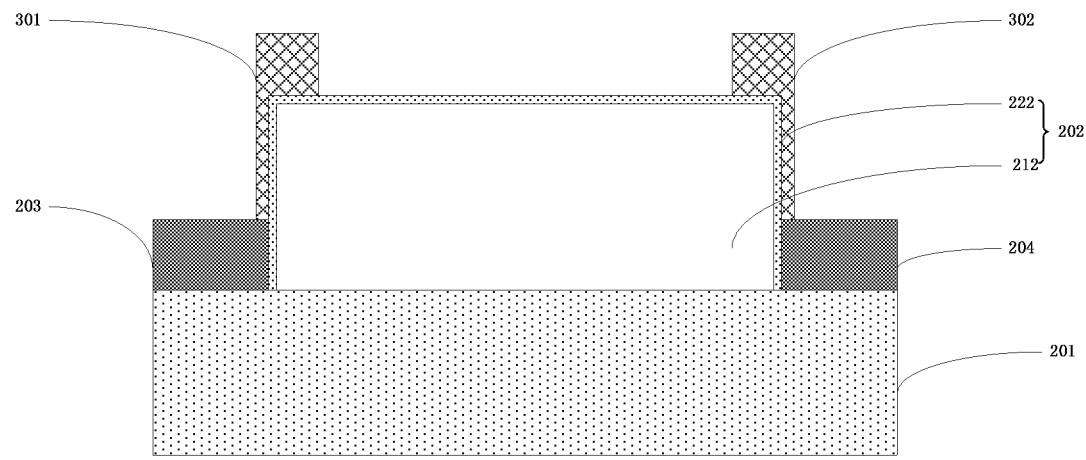
Figure 4:
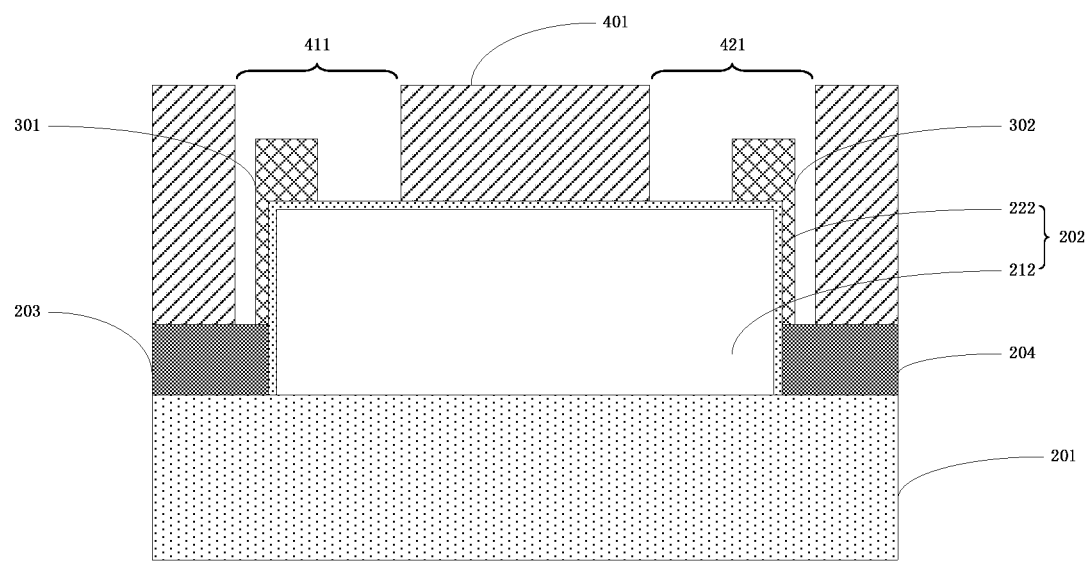

In an implementation manner, as shown in FIG. 3, a part of the first dummy gate structure 301 may be located at the first isolation region 203, and other parts of the first dummy gate structure 301 span over an end portion of the fin structure 202; and a part of the second dummy gate structure 302 may be located at the second isolation region 204, and other parts of the second dummy gate structure 302 span the other end portion of the fin structure 202. In another implementation manner, the first dummy gate structure 301 and the second dummy gate structure 302 may completely span over the two end portions of the fin structure 202 (not shown in the drawings).

Subsequently, in step 106, form a mask layer 401 having a first opening 411 and a second opening 421 on the structure shown in FIG. 3, for example, photoresist. Herein, the first opening 411 may expose the first dummy gate structure 301 and a part of the fin structure 202 that abuts against the first dummy gate structure 301. The second opening 421 may expose the second dummy gate structure 302 and a part of the fin structure 202 that abuts against the second dummy gate structure 302. In some implementations, the first opening 411 may further expose a part of the first isolation region 203, and the second opening 421 may further expose a part of the second isolation region 204. Preferably, widths of the exposed part of the first isolation region 203 and the exposed part of the second isolation region 204 may be about 10-50 nm, for example, 30 nm or 40 nm.

Figure 5:
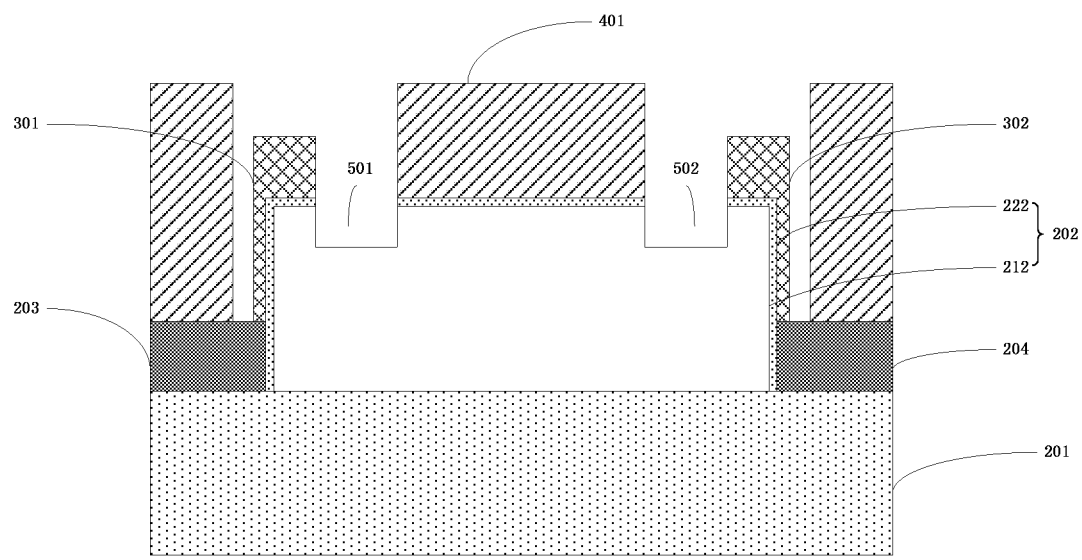

Subsequently, in step 108, the exposed parts of the fin structure 202 are etched using the mask layer 401 as a mask, so as to form a first recess 501 and a second recess 502, as shown in FIG. 5. Herein, when etching the exposed parts of the fin structure 202, the first dummy gate structure 301 and the second dummy gate structure 302 are also used as a mask, respectively.

Figure 6:
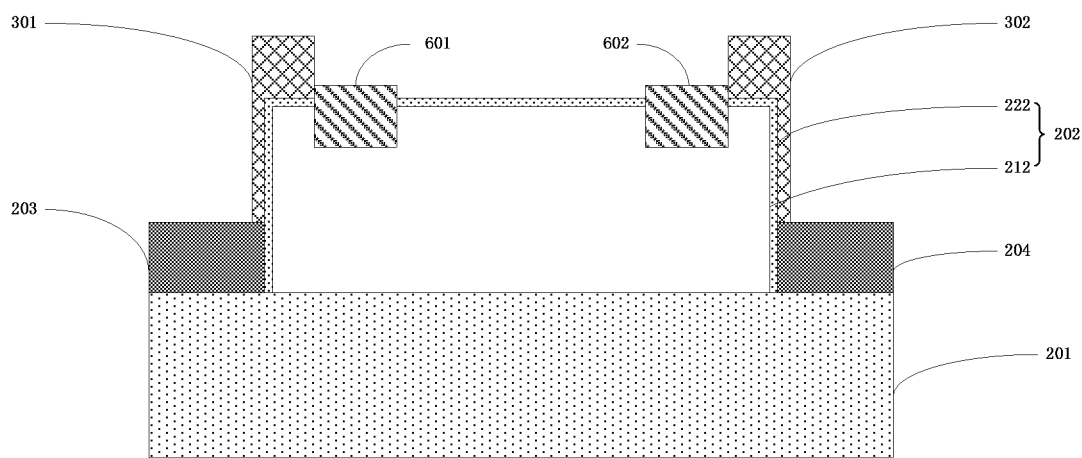

Subsequently, in step 110, the mask layer 401 is removed, and an epitaxially grown semiconductor material, such as Si or SiGe, is epitaxially grown in the first recess 501 and the second recess 502, so as to respectively form a first contact area 601 and a second contact area 602, as shown in FIG. 6. Herein, parts of the first contact area 601 and the second contact area 602 may be located within the semiconductor fin 212, and parts may protrude outside the semiconductor fin 212. The first contact area 601 and the second contact area 602 may also be called as raised first contact area 601 and second contact area 602.

In some implementations, in a case in which the well region has a first conductivity type, after the first contact area 601 and the second contact area 602 are formed, ion implantation may further be executed, so that the semiconductor fin 212, the first contact area 601, and the second contact area 602 have a second conductivity type which is different from the first conductivity type. For example, the well region is a N well, and the semiconductor fin 212, the first contact area 601, and the second contact area 602 are P+ doped. Further, for example, the well region is a P well, and the semiconductor fin 212, the first contact area 601, and the second contact area 602 are N+ doped. In some implementations, doping concentrations of the first contact area 601 and the second contact area 602 are higher than a doping concentration of the semiconductor fin 212. Therefore, contact resistance when forming a contact may be reduced.

Subsequently, a first contact connected to the first contact area 601 and a second contact connected to the second contact area 602 are formed.

Figure 7:
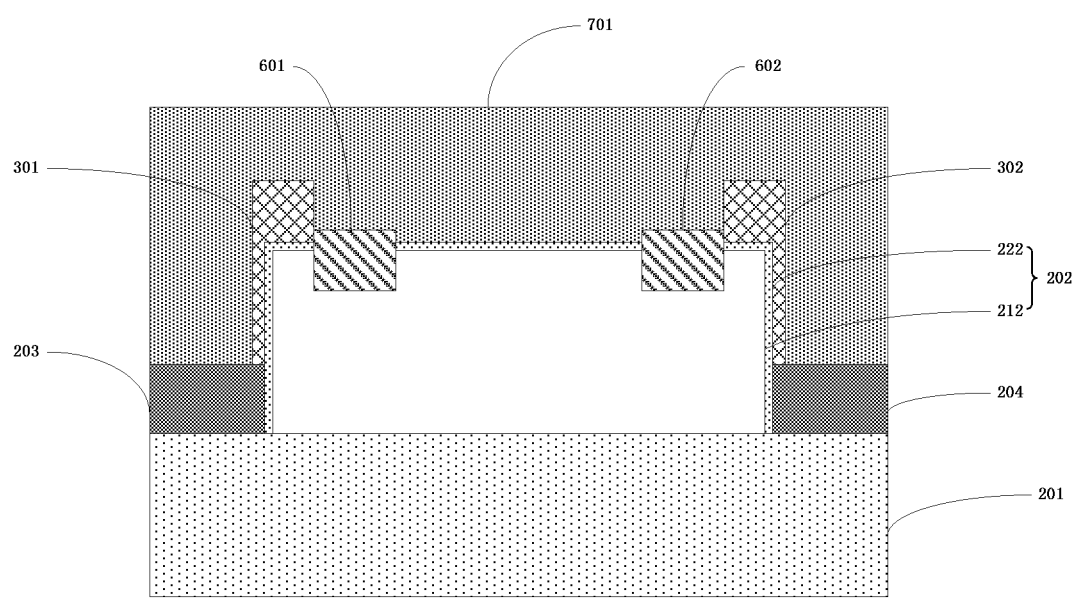
Figure 8:
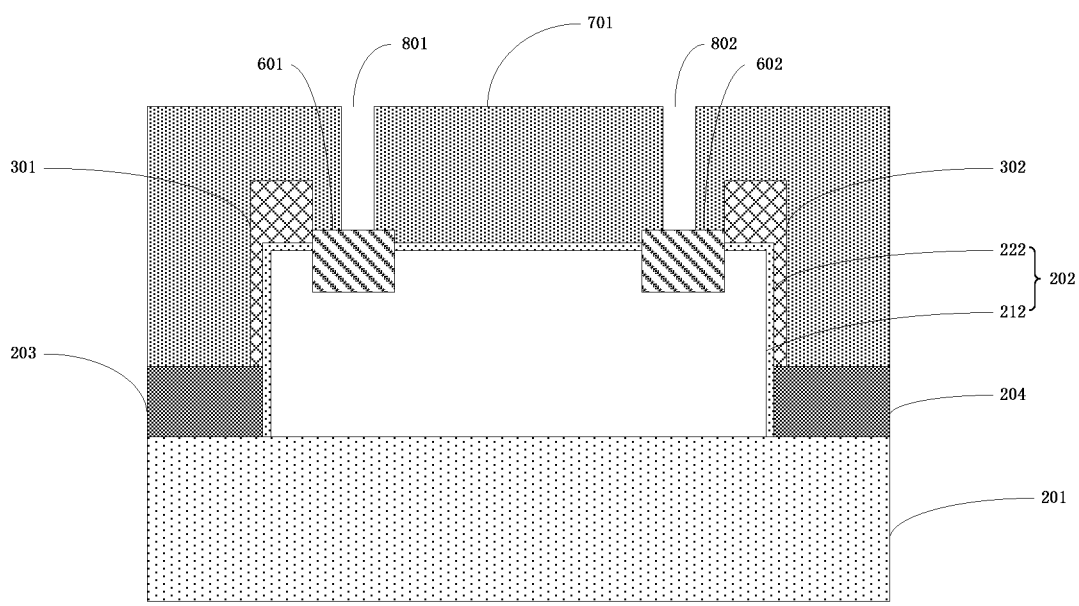
Figure 9:
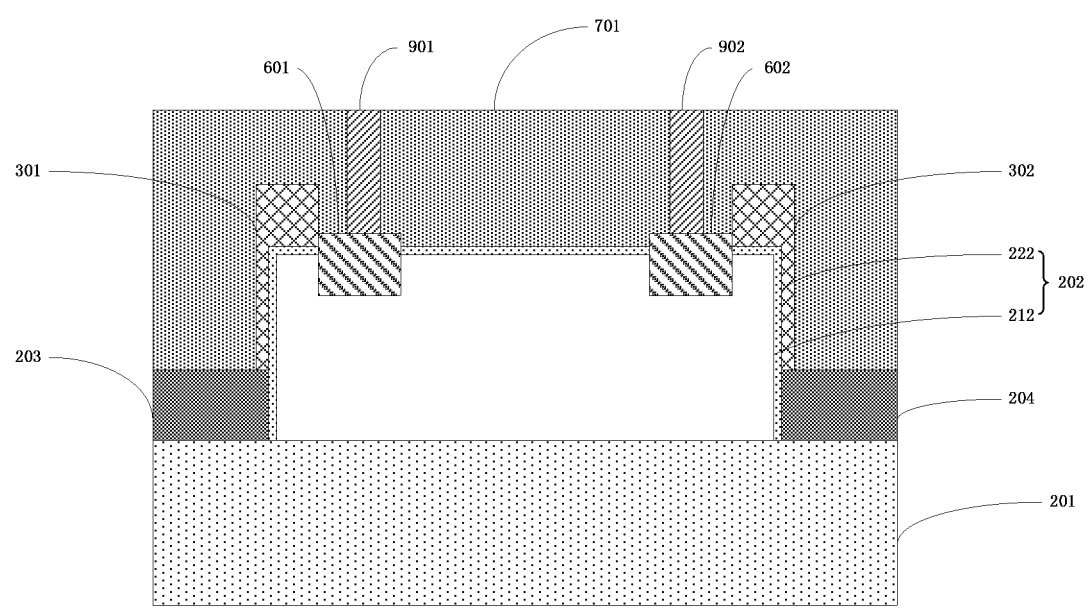

In some implementations, the first contact and the second contact may be formed according to the manner shown in FIG. 7 to FIG. 9.

As shown in FIG. 7, a dielectric layer 701, for example, an oxide of silicon, is deposited so as to cover the fin structure 202, the first dummy gate structure 301, the second dummy gate structure 302, the first contact area 601, and the second contact area 602.

As shown in FIG. 8, the dielectric layer 701 is etched, so as to form a first contact hole 801 extending to the first contact area 601 and a second contact hole 802 extending to the second contact area 602. For example, a patterned hard mask may be formed on the dielectric layer 701, so as to define shapes of the first contact hole and the second contact hole; and then the dielectric layer 701 is etched by using the patterned hard mask as a mask, so as to form the first contact hole 801 and the second contact hole 802. In some implementations, widths of the first contact hole and the second contact hole may be about 40-100 nm, for example, 60 nm or 80 nm; and a distance between the first contact hole 801 and the first dummy gate structure 301 and a distance between the second contact hole 802 and the second dummy gate structure 302 may be about 15-40 nm, for example, 20 nm or 30 nm.

As shown in FIG. 9, a metal, such as tungsten, is filled in the first contact hole 801 and the second contact hole 802, so as to form a first contact 901 and the second contact 902.

Implementations of a method for manufacturing a semiconductor resistor is described above. In one aspect, the method provided forms dummy gate structures at two ends of a fin structure, where the dummy gate structures may change appearances of epitaxially formed first contact area and second contact area. In addition, a position of an etched area is defined using a first opening and a second opening of a mask layer, and only parts of the fin structure that abut against the first dummy gate structure and the second dummy gate structure are etched. Therefore, an epitaxially formed contact area is merely located at two end portions of the fin structure instead of the entire upper portion of the fin structure. In this way, the probability that the epitaxially formed contact area merges with contact areas of other fin structures is reduced. Therefore, this implementation may relieve a phenomenon that adjacent semiconductor fins in a semiconductor resistor are merged, and improve uniformity of the semiconductor fins in the semiconductor resistor. Moreover, the manufacturing method of this implementation is compatible with a FinFET process.

The inventor finds that through adjusting a width of the first dummy gate structure 301, a width of the first opening 411, and a width of a part of the fin structure 202 that abuts against the first dummy gate structure 301, appearance of the first contact area 601 may be optimized, so as to better reduce the phenomenon that adjacent semiconductor fins in a semiconductor resistor are merged. Similarly, through adjusting a width of the second dummy gate structure 302, a width of the second opening 421, and a width of a part of the fin structure 202 that abuts against the second dummy gate structure 302, appearance of the second contact area 602 may be optimized, so as to better reduce the phenomenon that adjacent semiconductor fins in a semiconductor resistor are merged. Preferably, widths of the first dummy gate structure 301 and the second dummy gate structure 302 may be about 16-100 nm, for example, 30 nm, 50 nm, or 70 nm. In some implementations, widths of the first opening 411 and the second opening 421 may be about 86-200 nm, for example, 100 nm, 150 nm, or 180 nm. In some implementations, widths of a part of the fin structure 202 that abuts against the first dummy gate structure 301 and a part of the fin structure 202 that abuts against the second dummy gate structure 302 may be about 60-120 nm, for example, 80 nm or 90 nm.

The present disclosure further provides a semiconductor resistor. With reference to FIG. 9, the semiconductor resistor may include a substrate having a well region 201 and a fin structure 202 in the region 201. The fin structure 202 may include a semiconductor fin 212 and an insulating layer 222 at a surface of the semiconductor fin 212. Herein, the fin structure may include a plurality of approximately parallel fin structures (description is made below with reference to FIG. 10).

The semiconductor resistor may further include a first dummy gate structure 301 and a second dummy gate structure 302 at two end portions of the fin structure 202. In some implementations, side surfaces of the two end portions of the fin structure may respectively have a first isolation region 203 and a second isolation region 204, where a part of the first dummy gate structure 301 may be located at the first isolation region 203, and a part of the second dummy gate structure 302 may be located at the second isolation region 204.

The semiconductor resistor may further include a first contact area 601, a second contact area 602, a first contact 901 connected to the first contact area 601, and a second contact 902 connected to the second contact area 602. Herein, the first contact area 601 abuts against the first dummy gate structure 301, a part of the first contact area 601 is located in the semiconductor fin 212, and a part thereof protrudes outside the semiconductor fin 212. Additionally, the second contact area 602 abuts against the second dummy gate structure 302, a part of the second contact area 602 is located in the semiconductor fin 212, and a part thereof protrudes outside the semiconductor fin 212. Materials of the first contact area 601 and the second contact area 602 may include, for example, Si or SiGe.

In some implementations, the well region 201 may have a first conductivity type, and the semiconductor fin 212, the first contact area 601, and the second contact area 602 may have a second conductivity type. In some implementations, doping concentrations of the first contact area 601 and the second contact area 602 are higher than a doping concentration of the semiconductor fin 212.

Figure 10:
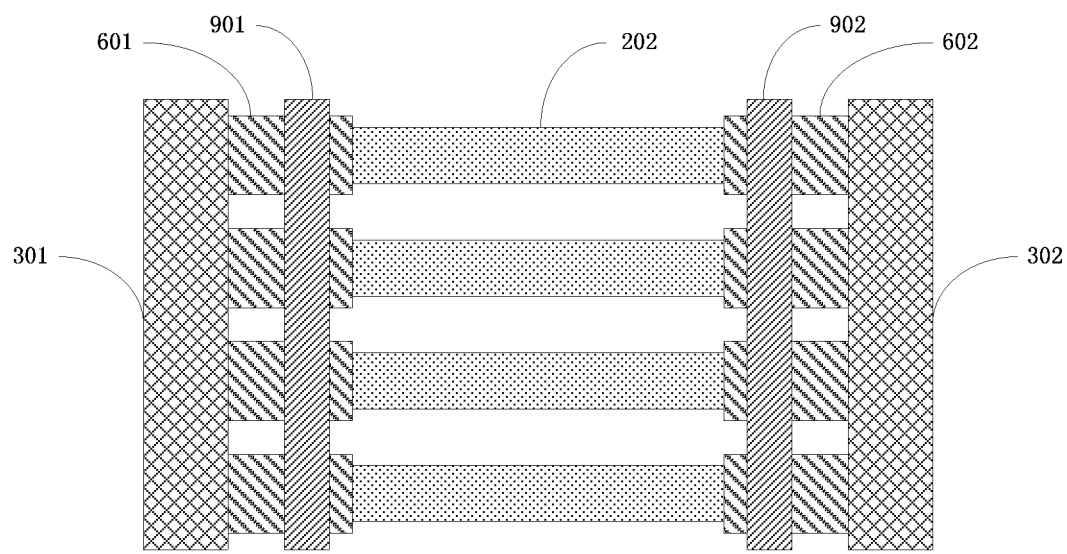
FIG. 10 shows a top view schematic diagram of a semiconductor resistor including a plurality of fin structures.

FIG. 10 shows a top view schematic diagram of one form of a semiconductor resistor including a plurality of fin structures. As shown in FIG. 10, the first dummy gate structure 301 and the second dummy gate structure 302 are located at two end portions of each fin structure, respectively. The first contact 901 is connected to the first contact area 601 in each fin structure, and the second contact 902 is connected to the second contact area 602 in each fin structure.

In actual applications, a size of a semiconductor resistor may be adjusted by adjusting the quantity of fin structures. For example, when an expected resistance value is great, a small number of fin structures may be used, for example, using one fin structure; and when the expected resistance value is small, a large number of fin structures may be used, for example, using two or more fin structures, so as to satisfy the requirements of the resistance value. In a case in which the semiconductor resistor provided in the present disclosure includes a plurality of fin structures, because adjacent semiconductor fins would not be merged, the quantity of the fin structures may be controlled more easily according to the size of the semiconductor resistor.

Figure 11:
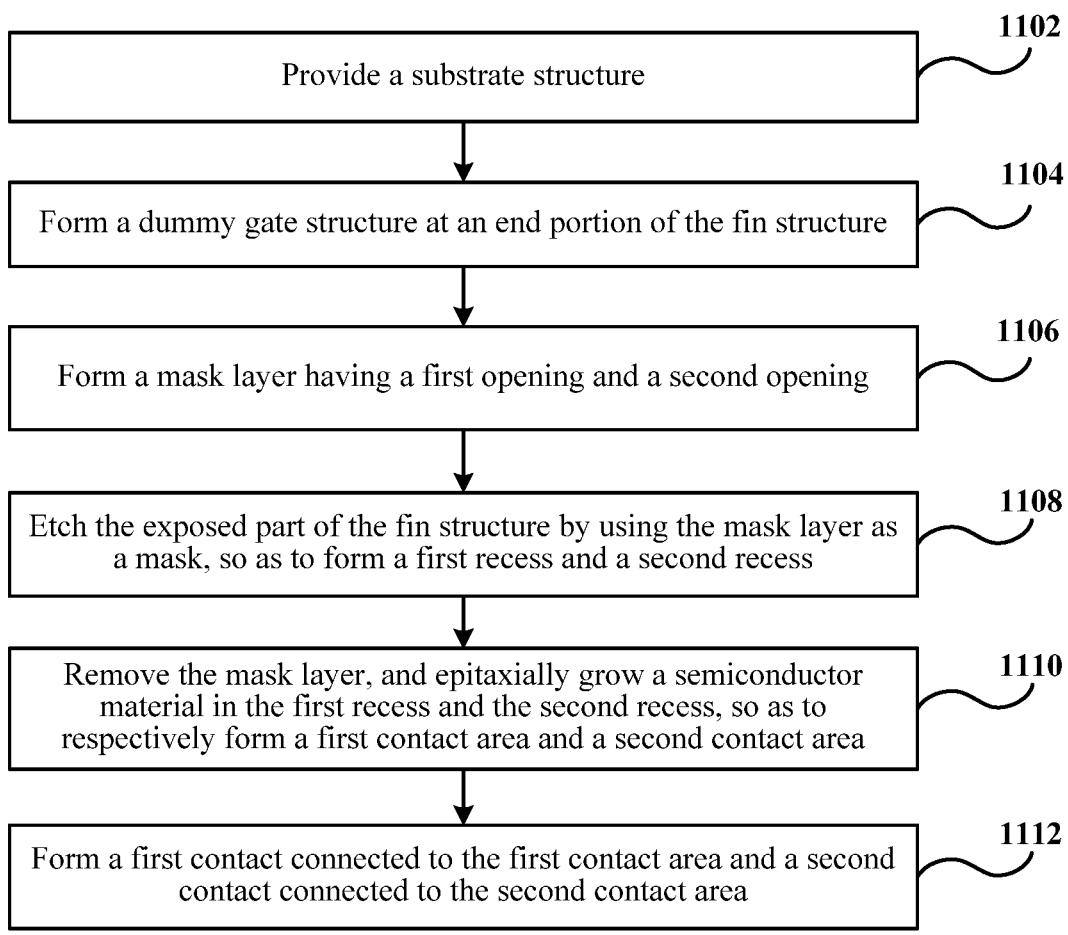
FIG. 11 is a simplified flowchart of another form of a method for manufacturing a semiconductor resistor.

In some implementations, widths of the first dummy gate structure 301 and the second dummy gate structure 302 are about 16-100 nm, for example, 30 nm, 50 nm, or 70 nm. In some implementations, widths of the first contact area 601 and the second contact area 602 are about 60-120 nm, for example, 80 nm or 90 nm. In some implementations, widths of the first contact 901 and the second contact 902 are about 40-100 nm, for example, 60 nm or 80 nm. In some implementations, a distance between the first contact 901 and the first dummy gate structure 301 and a distance between the second contact 902 and the second dummy gate structure 302 are about 15-40 nm, for example, 20 nm or 30 nm. In addition, the inventor finds that: only forming a dummy gate structure at an end portion of the fin structure may also improve the phenomenon that adjacent semiconductor fins in a semiconductor resistor are merged. Therefore, the present disclosure further provides the following solutions:

FIG. 11 is a simplified flowchart of one form of a method for manufacturing a semiconductor resistor. As shown in FIG. 11, the manufacturing method may include the following steps:

Step 1102, provide a substrate structure, where the substrate structure includes a substrate having a well region and a fin structure in the well region, where the fin structure includes a semiconductor fin and an insulating layer at a surface of the semiconductor fin.

Step 1104, form a dummy gate structure at an end portion of the fin structure. In some implementations, a side surface of an end portion of the fin structure (the end portion at which the dummy gate structure is formed) may be provided with an isolation region on which a part of the dummy gate structure may be located. In some implementations, a width of the dummy gate structure 302 may be about 16-100 nm, for example, 30 nm, 50 nm, or 70 nm.

Step 1106, form a mask layer having a first opening and a second opening, where the first opening exposes the dummy gate structure and a part of the fin structure that abuts against the dummy gate structure, and the second opening exposes another end portion of the fin structure. In some implementations, a width of the first opening may be about 86-200 nm, for example, 100 nm, 150 nm, or 180 nm. A width of the part of the fin structure that abuts against the dummy gate structure may be about 60-120 nm, for example, 80 nm or 90 nm. In some implementations, the first opening may further expose a part of the isolation region. In some implementations, a width of the exposed part of the isolation region may be about 10-50 nm, for example, 30 nm or 40 nm.

Step 1108, etch the exposed part of the fin structure using the mask layer as a mask, so as to form a first recess and a second recess. When etching the exposed part of the fin structure, the dummy gate structure may also be used as a mask.

Step 1110, remove the mask layer, and epitaxially grow a semiconductor material, such as Si or SiGe, in the first recess and the second recess, so as to respectively form a first contact area and a second contact area.

Step 1112, form a first contact connected to the first contact area and a second contact connected to the second contact area.

Compared with the implementations shown in FIG. 1, the method provided in this implementation only forms a dummy gate structure at an end of a fin structure, where the dummy gate structure may change appearance of an epitaxially formed first contact area. In addition, a position of an etched area is defined using a first opening and a second opening of a mask layer, and only a part of the fin structure that abuts against the dummy gate structure and the other end portion of the fin structure are etched. Therefore, an epitaxially formed contact area is merely located at two end portions of the fin structure instead of the entire upper portion of the fin structure. In this way, the probability that the contact area merges with contact areas of other fin structures is reduced. Therefore, implementations of this manufacturing method may also relieve a phenomenon that adjacent semiconductor fins in a semiconductor resistor are merged, and improve uniformity of the semiconductor fins in the semiconductor resistor. Moreover, implementations of this manufacturing method is compatible with a FinFET process.

The present disclosure further provides another semiconductor resistor, including a substrate having a well region and a fin structure in the region. The fin structure includes a semiconductor fin and an insulating layer at a surface of the semiconductor fin.

The semiconductor resistor further includes a dummy gate structure at an end portion of the fin structure. In one form, a side surface of an end portion of fin structure may be provided with an isolation region on which a part of the dummy gate structure may be located.

The semiconductor resistor may further include a first contact area, a second contact area, a first contact connected to the first contact area, and a second contact connected to the second contact area. The first contact area abuts against the dummy gate structure, and a part of the first contact area is located in the semiconductor fin. A part of the second contact area is located in another end portion of the semiconductor fin.

Heretofore, a semiconductor resistor and a manufacturing method therefor according to different embodiments and forms of the present disclosure are described in detail. In describing the present disclosure, some details generally known in the art are not described. According to the foregoing description, a person skilled in the art may completely understand how to implement the technical solutions disclosed herein. In addition, the embodiments and forms according to the teaching disclosed in the specification may be freely combined. A person skilled in the art should understand that various amendments may be made to the embodiments described above without departing from the spirit and scope of the present disclosure that are defined by the appended claims.

What is claimed is:

1. A method for manufacturing a semiconductor resistor, comprising:
   providing a substrate structure, wherein the substrate structure comprises a substrate having a well region and a fin structure in the well region, and wherein the fin structure comprises a semiconductor fin and an insulating layer at a surface of the semiconductor fin;
   forming a first dummy gate structure and a second dummy gate structure at two end portions of the fin structure, respectively;
   after forming the first dummy gate structure and the second dummy gate structure, forming a mask layer having a first opening and a second opening, wherein the first opening exposes the first dummy gate structure and a part of the fin structure that abuts against the first dummy gate structure, and the second opening exposes the second dummy gate structure and a part of the fin structure that abuts against the second dummy gate structure;
   after forming the mask layer, etching an exposed part of the fin structure that abuts against the first dummy gate structure using the mask layer as a mask and etching an exposed part of the fin structure that abuts against the second dummy gate structure using the mask layer as a mask, so as to form a first recess and a second recess;

removing the mask layer and epitaxially growing a semiconductor material in the first recess and the second recess, so as to respectively form a first contact area and a second contact area, which are the only two contact areas formed at the fin structure; and forming a first contact connected to the first contact area and a second contact connected to the second contact area.

2. The method according to claim 1, wherein side surfaces of the two end portions of the fin structure respectively have a first isolation region and a second isolation region;

a part of the first dummy gate structure is located at the first isolation region; and a part of the second dummy gate structure is located at the second isolation region.

3. The method according to claim 2, wherein the first opening further exposes a part of the first isolation region, and the second opening further exposes a part of the second isolation region.

4. The method according to claim 1, wherein the respectively forming a first contact and a second contact in the first contact area and the second contact area comprises:

depositing a dielectric layer so as to cover the fin structure, the first dummy gate structure, the second dummy gate structure, the first contact area, and the second contact area;

etching the dielectric layer, so as to form a first contact hole extending to the first contact area and a second contact hole extending to the second contact area; and filling in the first contact hole and the second contact hole with a metal, so as to form the first contact and the second contact.

5. The method according to claim 1, wherein the well region has a first conductivity type; and wherein the method further comprises after the first contact area and the second contact area are formed, executing ion implantation, so that the semiconductor fin, the first contact area, and the second contact area have a second conductivity type which is different from the first conductivity type.

6. The method according to claim 5, wherein doping concentrations of the first contact area and the second contact area are higher than a doping concentration of the semiconductor fin.

7. The method according to claim 1, wherein the fin structure comprises a plurality of approximately parallel fin structures; and the first dummy gate structure and the second dummy gate structure are located at two end portions of each fin structure, respectively.

8. The method according to claim 1, wherein the semiconductor material comprises Si or SiGe.

9. The method according to claim 1, wherein a width of the first dummy gate structure and a width of the second dummy gate structure are between 16-100 nm;

a width of the first opening and a width of the second opening are between 86-200 nm;

a width of the part of the fin structure that abuts against the first dummy gate structure and a width of the part of the fin structure that abuts against the second dummy gate structure are between 60-120 nm;

a width of the first contact hole and a width of the second contact hole are between 40-100 nm; and a distance between the first contact hole and the first dummy gate structure and a distance between the second contact hole and the second dummy gate structure are 15-40 nm.

10. The method according to claim 3, wherein a width of the exposed part of the first isolation region and a width of the exposed part of the second isolation region are 10-50 nm.

11. A method for manufacturing a semiconductor resistor, comprising:

providing a substrate structure, wherein the substrate structure comprises a substrate having a well region and a fin structure in the well region, and wherein the fin structure comprises a semiconductor fin and an insulating layer at a surface of the semiconductor fin;

forming a dummy gate structure at only one end portion of the fin structure;

after forming the dummy gate structure, forming a mask layer having a first opening and a second opening, wherein the first opening exposes the dummy gate structure and a part of the fin structure that abuts against the dummy gate structure, and the second opening exposes another end portion of the fin structure;

after forming the mask layer, etching an exposed part of the fin structure using the mask layer as a mask, so as to form a first recess and a second recess;

removing the mask layer, and epitaxially growing a semiconductor material in the first recess and the second recess, so as to respectively form a first contact area and a second contact area; and forming a first contact connected to the first contact area and a second contact connected to the second contact area.

12. The method according to claim 11, wherein a side surface of the end portion of the fin structure has an isolation region; and a part of the dummy gate structure is located at the isolation region.

13. The method according to claim 12, wherein the first opening further exposes a part of the isolation region.

* * * * *